United States Patent
Lee et al.

(10) Patent No.: US 8,053,263 B2
(45) Date of Patent: Nov. 8, 2011

(54) METHOD OF MANUFACTURING SEMICONDUCTOR LIGHT EMITTING DEVICE

(75) Inventors: Moon-sang Lee, Seoul (KR); Sung-soo Park, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 64 days.

(21) Appl. No.: 12/585,492

(22) Filed: Sep. 16, 2009

(65) Prior Publication Data

US 2010/0178720 A1    Jul. 15, 2010

(30) Foreign Application Priority Data

Jan. 15, 2009  (KR) .................. 10-2009-0003408

(51) Int. Cl.
*H01L 21/00* (2006.01)
(52) U.S. Cl. .................. 438/46; 257/E21.09
(58) Field of Classification Search ............ 438/46, 438/47
See application file for complete search history.

(56) References Cited

U.S. PATENT DOCUMENTS

| | | | |
|---|---|---|---|
| 6,486,042 B2 | 11/2002 | Gehrke et al. | |
| 2004/0262636 A1 | 12/2004 | Yang et al. | |
| 2007/0004066 A1* | 1/2007 | Wuu et al. | 438/29 |
| 2008/0036038 A1* | 2/2008 | Hersee et al. | 257/615 |

FOREIGN PATENT DOCUMENTS

| | | |
|---|---|---|
| JP | 2000-091252 | 3/2000 |
| JP | 2000-286450 | 10/2000 |
| JP | 2001-267244 | 9/2001 |
| JP | 2002-293698 | 10/2002 |
| JP | 2007-027298 | 2/2007 |
| KR | 10-2006-0061568 | 6/2006 |
| KR | 1020080023821 | * 3/2008 |

OTHER PUBLICATIONS

Kazuhide Kusakabe, et al.. "*Characterization of Overgrown GaN Layers on Nano-Columns Grown by RF-Molecular Beam Epitaxy*", The Japan Society of Applied Physics, vol. 40, pp. L192-L194 (2001).

Srinivasan Raghavan, et al., *Growth Stresses and cracking in GaN films on (1 1 1) Si grown by metalorganic chemical vapor deposition. II. Graded AlGaN buffer layers*, Journal of Applied Physics, 98, 023515 (2005).

C.K. Inoki, et al. *Growth of GaN on porpus SiC and GaN substrates*, Phys. Stats, Sol. (a) 200, 44 (2003).

* cited by examiner

*Primary Examiner* — Charles Garber
*Assistant Examiner* — Reema Patel
(74) *Attorney, Agent, or Firm* — Harness, Dickey & Pierce, P.L.C.

(57) ABSTRACT

A method of manufacturing a semiconductor light emitting device may include forming an insulating layer on a substrate, forming a plurality of first holes in the insulating layer, forming a plurality of GaN rods in the plurality of first holes, and laterally growing an n-GaN layer on the plurality of GaN rods.

9 Claims, 7 Drawing Sheets

METHOD OF MANUFACTURING SEMICONDUCTOR LIGHT EMITTING DEVICE

CROSS-REFERENCE TO RELATED APPLICATION

This application claims priority under 35 U.S.C. §119 to Korean Patent Application No. 10-2009-0003408, filed on Jan. 15, 2009 with the Korean Intellectual Property Office, the entire disclosure of which is incorporated herein by reference.

BACKGROUND

1. Field

Example embodiments relate to a method of forming a gallium nitride (GaN) thin film with a relatively low defect density on a silicon substrate.

2. Description of the Related Art

Sapphire substrates are conventionally used for semiconductor light emitting devices. Gallium nitride (GaN) light emitting cells may be easily grown to a thickness of 5 μm or more on a sapphire substrate. However, a sapphire substrate is relatively expensive and more difficult to manufacture for larger diameters.

Light emitting devices may also have GaN light emitting cells grown on a silicon substrate. However, a relatively high number of cracks in the GaN light emitting cells may form as a result of differences in lattice constants and thermal expansion coefficients between the GaN light emitting cells and the silicon substrate. The number of cracks may increase with GaN layer thickness.

Furthermore, because the silicon substrate absorbs a portion of light emitted by the GaN light emitting cells, the amount of light actually emitted is reduced. To increase the amount of light emitted, an additional process of removing the silicon substrate from the GaN light emitting cells may be required.

SUMMARY

Example embodiments relate to a method of manufacturing a light emitting device involving forming a GaN layer having a relatively low defect density on a silicon substrate. A method of manufacturing a semiconductor light emitting device may include forming an insulating layer on a substrate; forming a plurality of first holes in the insulating layer; forming a plurality of gallium nitride (GaN) rods in the plurality of first holes; laterally growing an n-GaN layer on the GaN rods; and sequentially forming an active layer and a p-GaN layer on the n-GaN layer. The substrate may be a silicon substrate. The GaN rods may have a height greater than a thickness of the insulating layer. Each of the GaN rods may have a diameter of about 10 nm to about 100 nm. The insulating layer may be formed of silicon dioxide ($SiO_2$).

The method may further comprise forming a reflective layer on the insulating layer. The reflective layer may be formed of titanium dioxide ($TiO_2$). The method may also further comprise forming the plurality of first holes in the insulating layer and the reflective layer. The GaN rods may have a height greater than a combined thickness of the insulating layer and the reflective layer.

The method may further comprise forming a stack of 3 to 5 sets of the insulating layer and the reflective layer prior to forming the plurality of first holes, wherein the reflective layer on the insulating layer constitutes a set. Each of the insulating layer and the reflective layer may have a thickness of about 10 nm to about 100 nm.

A method of manufacturing a semiconductor light emitting device may also include forming an insulating layer on a substrate; forming a plurality of second holes in the insulating layer; forming a plurality of ZnO rods in the plurality of second holes, each ZnO rod having a height greater than a thickness of the insulating layer; forming a GaN covering on outer peripheries of the ZnO rods via GaN deposition; forming hollow GaN rods by removing the ZnO rods; laterally growing an n-GaN layer on the hollow GaN rods; and sequentially forming an active layer and a p-GaN layer on the n-GaN layer.

The ZnO rods may have a height greater than a thickness of the insulating layer. Each of the hollow GaN rods may have a thickness of about 100 nm to about 10 μm. The ZnO rods may be removed by thermal decomposition at a temperature of about 600° C. to about 900° C. The GaN deposition may occur at a temperature lower than a thermal decomposition temperature of the ZnO rods.

BRIEF DESCRIPTION OF THE DRAWINGS

The above and/or other aspects of example embodiments may become apparent and more readily appreciated upon review of the following detailed description, taken in conjunction with the accompanying drawings of which.

DETAILED DESCRIPTION

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Reference will now be made in further detail with regard to various examples illustrated in the accompanying drawings. The thicknesses of layers and/or regions illustrated in the drawings may have been exaggerated for clarity. Furthermore, because like elements are denoted by like reference numerals, the detailed explanation with regard to a previously discussed like element may have been omitted for purposes of brevity.

Figures 1, 2A:
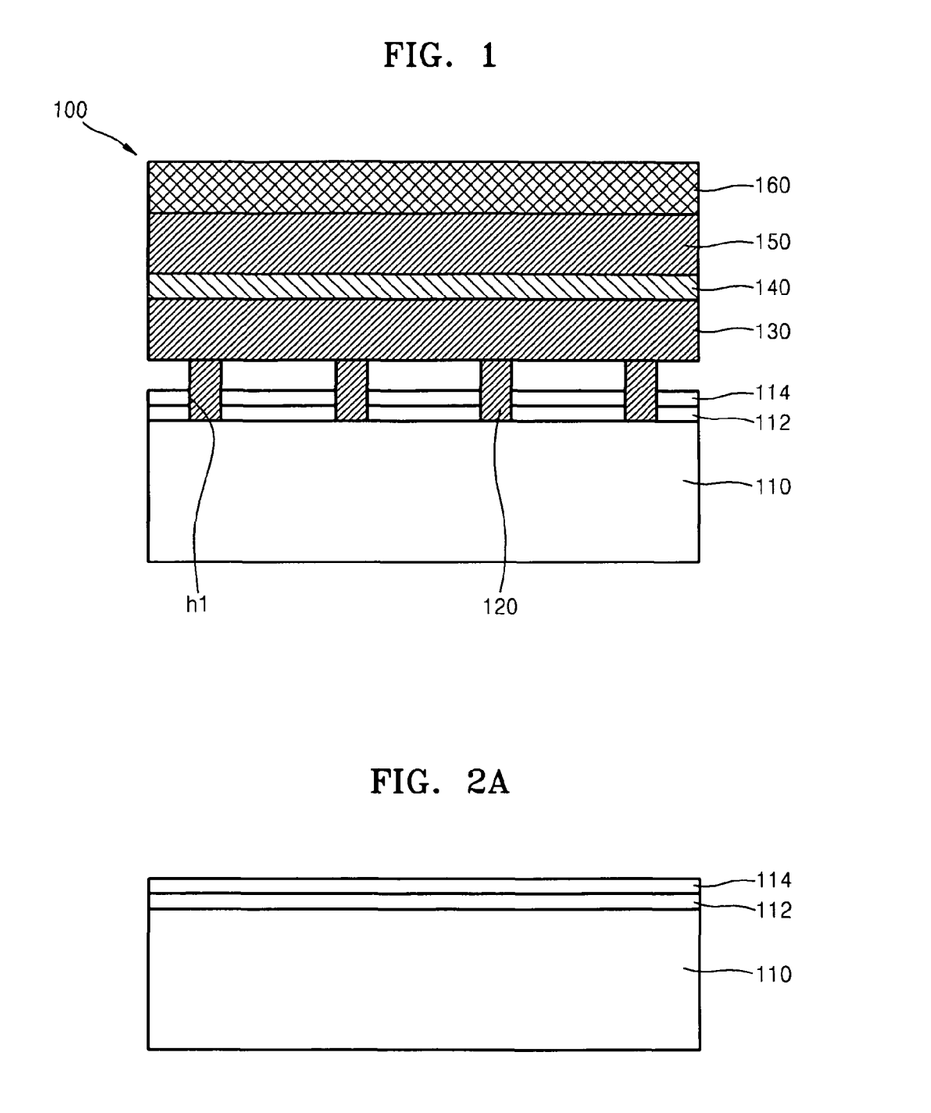
FIG. 1 is a cross-sectional view of a semiconductor light emitting device manufactured with a method according to example embodiments.
FIGS. 2A through 2D are cross-sectional views illustrating a method of manufacturing the semiconductor light emitting device of FIG. 1.

FIG. 1 is a cross-sectional view of a semiconductor light emitting device manufactured with a method according to example embodiments. Referring to FIG. 1, the semiconductor light emitting device 100 may include an insulating layer 112 and a reflective layer 114 sequentially formed on a substrate 110. A plurality of first holes h1 may be formed in the insulating layer 112 and the reflective layer 114. Each of the plurality of first holes h1 may have a diameter of about 10 nm to about 100 nm. A plurality of n-GaN rods 120 may be grown on the substrate 110 within the first holes h1 so as to have a height that is greater than the combined thickness of the insulating layer 112 and the reflective layer 114. For instance, the n-GaN rods 120 may extend past a surface of the reflective layer 114 by about 10 nm to about 1 μm.

An n-GaN layer 130, an active layer 140, a p-GaN layer 150, and a transparent electrode layer 160 may be stacked sequentially on the n-GaN rods 120. The n-GaN layer 130, which may be laterally grown on the GaN rods 120, may have a relatively low defect density and relatively few cracks. Accordingly, the semiconductor light emitting device 100 may reduce or prevent the luminous efficiency from being unduly decreased by cracks in the n-GaN layer 130.

FIGS. 2A through 2D are cross-sectional views illustrating a method of manufacturing the semiconductor light emitting device 100 of FIG. 1. Like elements of FIG. 2A through 2D and FIG. 1 are denoted by like reference numerals. Referring to FIG. 2A, the substrate 110 (e.g., an n-type silicon substrate) may have a (111) plane. An insulating layer 112 and a reflective layer 114 may be deposited sequentially on the substrate 110. The insulating layer 112, which may be formed of silicon dioxide ($SiO_2$), may be deposited to a thickness of about 10 nm to about 100 nm. The reflective layer 114, which may be formed of titanium dioxide ($TiO_2$), may be deposited to a thickness of about 10 nm to about 100 nm using chemical vapour deposition (CVD). Although only one insulating layer 112 and only one reflective layer 114 are illustrated as being deposited in FIG. 2A, example embodiments are not limited thereto. For instance, 2 to 5 sets (not shown) of the reflective layer 114 and the insulating layer 112 may be deposited on the substrate 110, wherein the reflective layer 114 on the insulating layer 112 constitutes a set.

Figure 2B:
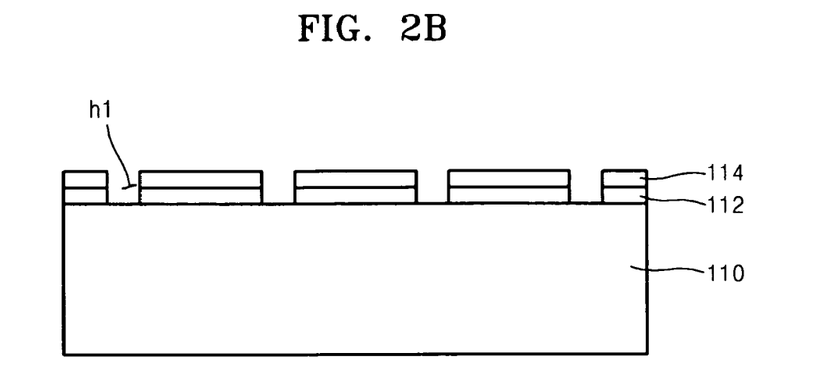

Referring to FIG. 2B, the reflective layer 114 and the insulating layer 112 may be patterned (e.g., using lithography) to form a plurality of first holes h1. Each of the first holes h1 may have a diameter of about 10 nm to about 100 nm.

Figure 2C:
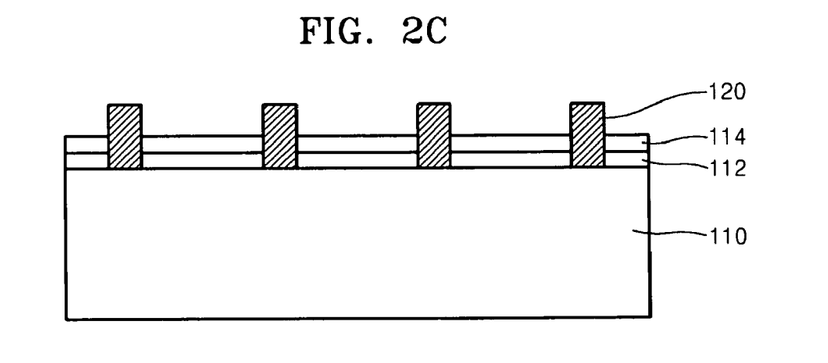

Referring to FIG. 2C, n-GaN rods 120 may be grown in the first holes h1 using hydride vapour phase expitaxy (HVPE). Each of the n-GaN rods 120 may have the same diameter as that of the first holes h1. The n-GaN rods 120 may be grown to have a height greater than the combined thickness of the insulating layer 112 and the reflective layer 114. For example, the n-GaN rods 120 may be higher than the combined thickness of the insulating layer 112 and the reflective layer 114 by about 10 nm to about 100 nm.

Figure 2D:
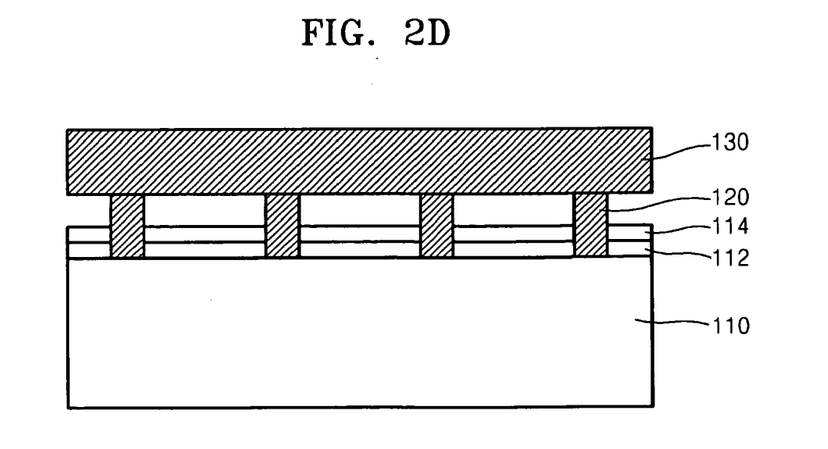

Referring to FIG. 2D, n-GaN may be laterally grown on the n-GaN rods 120 to form the n-GaN layer 130. For the lateral growth, a gallium fluoride precursor and an ammonia precursor may be supplied at a Ga/N atomic ratio of about 20-100 to a reactor at a temperature of about 1000° C. to about 1100° C. The n-GaN layer 130 may grow to a thickness of about 3 μm to about 10 μm. The n-GaN layer 130 may not have any cracks and may have a defect density of less than about $10^8/cm^2$, which may be similar to the defect density of a GaN layer grown on a sapphire substrate.

Referring back to FIG. 1, an active layer 140, a p-GaN layer 150, and a transparent electrode layer 160 may be sequentially formed on the n-GaN layer 130. The active layer 140 may have a multi-quantum well structure. Manufacturing the active layer 140, the p-GaN layer 150, and the transparent electrode layer 160 may be performed using well-known semiconductor processes. As a result, a detailed explanation thereof will not be given.

Figure 3:
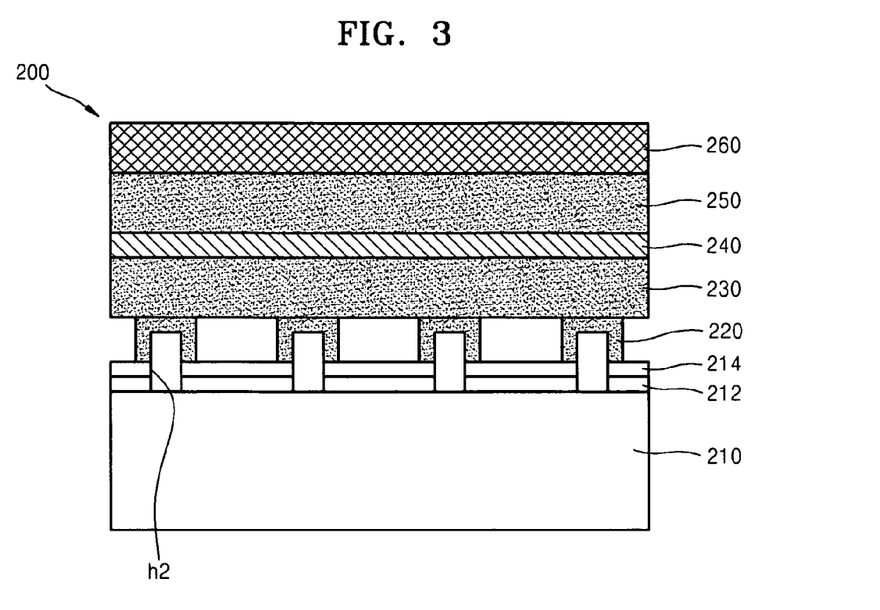
FIG. 3 is a cross-sectional view of another semiconductor light emitting device manufactured with a method according to example embodiments.

FIG. 3 is a cross-sectional view of a semiconductor light emitting device 200 manufactured with a method according to example embodiments. Referring to FIG. 3, the semiconductor light emitting device 200 may include an insulating layer 212 and a reflective layer 214 formed sequentially on a substrate 210. A plurality of second holes h2 may be formed in the insulating layer 212 and the reflective layer 214. Each of the second holes h2 may have a diameter of about 10 nm to about 100 nm. Hollow n-GaN rods 220 (having a hollow space connected to the second hole h2) may be formed on the reflective layer 214. The hollow n-GaN rods 220 may have a height of about 10 nm to about 100 nm.

An n-GaN layer 230, an active layer 240, a p-GaN layer 250 and a transparent electrode layer 260 may be stacked sequentially on the n-GaN rods 220. The n-GaN layer 230, which may be laterally grown on the hollow n-GaN rods 220, may have a relatively low defect density and relatively few cracks. Accordingly, the semiconductor light emitting device 200 may reduce or prevent the luminous efficiency from being unduly decreased by cracks in the n-GaN layer 230.

Figure 4A:
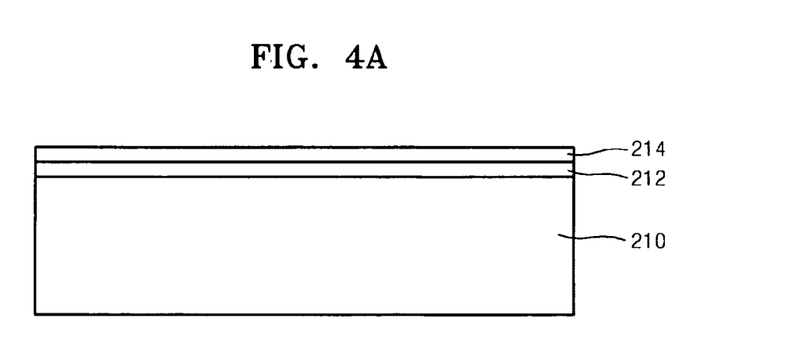
FIGS. 4A through 4F are cross-sectional views illustrating a method of manufacturing the semiconductor light emitting device of FIG. 3.

FIGS. 4A through 4F are cross-sectional views illustrating a method of manufacturing the semiconductor light emitting device 200 of FIG. 3. Like elements of FIGS. 4A through 4F and FIG. 3 are denoted by like reference numerals. As a result, a detailed explanation of previously discussed like elements may be been omitted for purposes of brevity. Referring to FIG. 4A, the substrate 210 (e.g., an n-type silicon substrate) may have a (111) plane. An insulating layer 212 and a reflective layer 214 may be deposited sequentially on the substrate 210. The insulating layer 212, which may be formed of $SiO_2$, may be deposited to a thickness of about 10 nm to about 1 µm. The reflective layer 214, which may be formed of $TiO_2$, may be deposited by CVD to a thickness of about 10 nm to about 100 nm. Although only one insulating layer 212 and only one reflective layer 214 are illustrated as being deposited in FIG. 4A, example embodiments are not limited thereto. For instance, 2 to 5 sets (not shown) of the reflective layer 214 and the insulating layer 212 may be deposited on the substrate 210, wherein the reflective layer 214 on the insulating layer 212 constitutes a set.

Figure 4B:
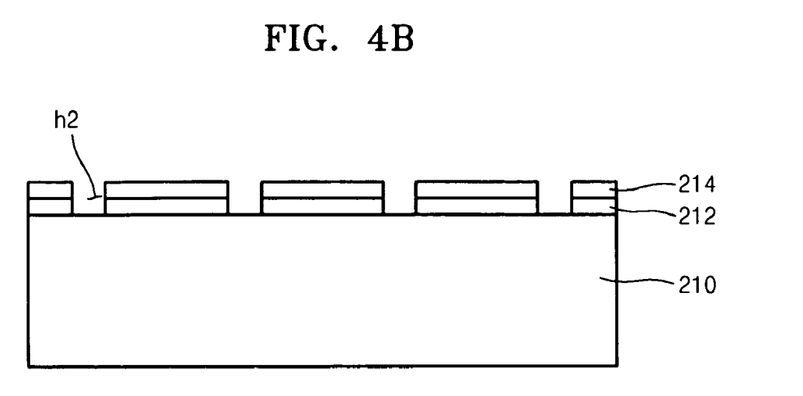
Figure 4C:
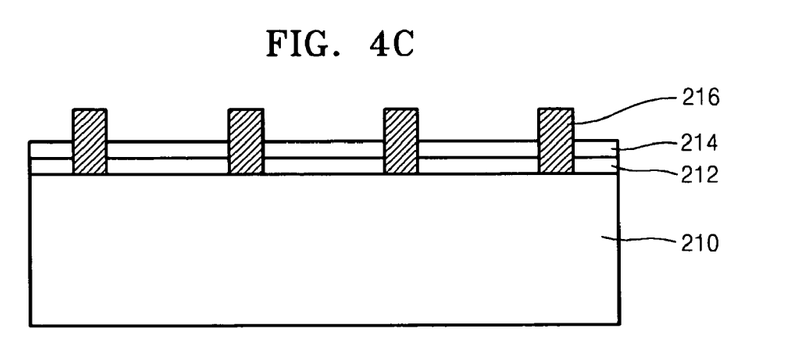

Referring to FIG. 4B, the reflective layer 214 and the insulating layer 212 may be patterned (e.g., using lithography) to form a plurality of second holes h2. Each of the second holes h2 may have a diameter of about 10 nm to about 100 nm. Referring to FIG. 4C, zinc oxide (ZnO) rods 216 may be grown using HVPE in the second holes h2. Each of the ZnO rods 216 may have the same diameter as that of the second holes h2. The ZnO rods 216 may be grown to a height greater than the combined thickness of the insulating layer 212 and the reflective layer 214. For example, the ZnO rods 216 may be higher than the combined thickness of the insulating layer 212 and the reflective layer 214 by about 10 nm to about 100 nm.

Figure 4D:
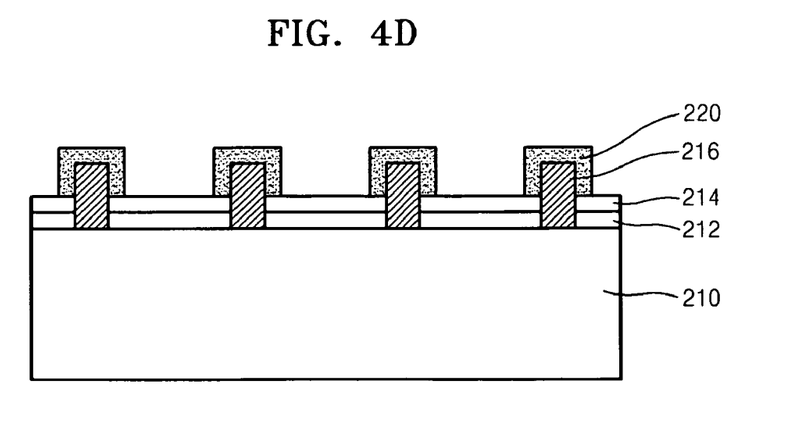

Referring to FIG. 4D, an n-GaN covering 220 may be formed on each of the ZnO rods 216. The n-GaN covering 220 may be deposited to a thickness of about 0.1 µm to about 10 µm at a temperature of about 400° C. to about 700° C., which is lower than the thermal decomposition temperature of ZnO in that environment.

Figure 4E:
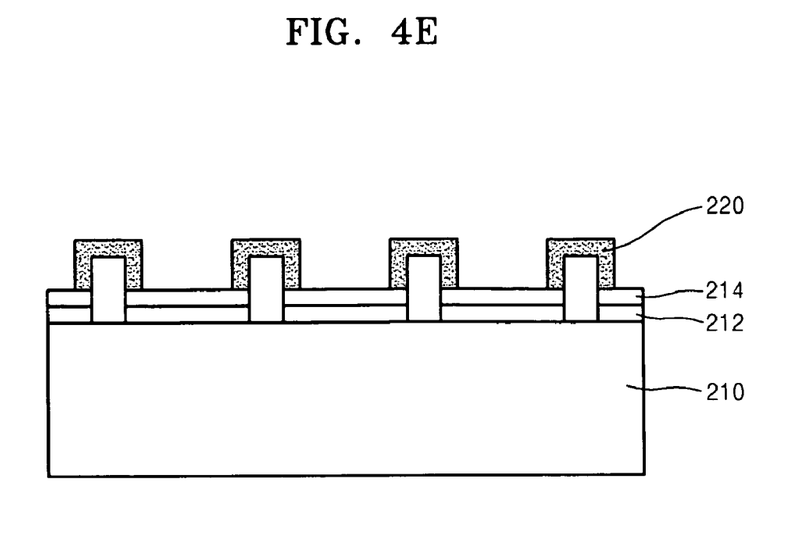

Referring to FIG. 4E, the substrate 210 may be heat treated to thermally decompose and remove the ZnO rods 216. For instance, the substrate 210 may be heat treated at a temperature of about 600° C. to about 700° C. in an $NH_3$ atmosphere, or at a temperature of about 600° C. to about 900° C. in an $H_2$ atmosphere. The n-GaN covering 220 when the ZnO rods 216 have been removed may be referred to as hollow n-GaN rods 220

Figure 4F:
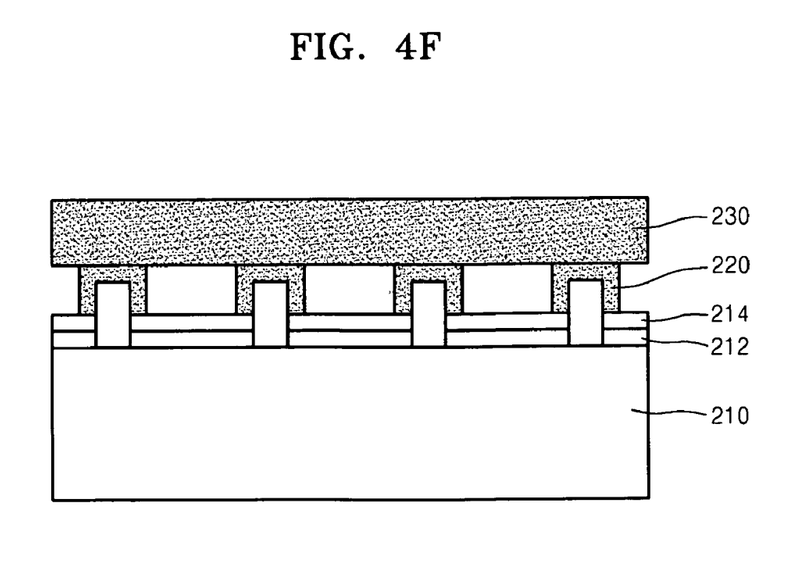

Referring to FIG. 4F, n-GaN may be laterally grown on the hollow n-GaN rods 220 to form the n-GaN layer 230. For the lateral growth, a gallium fluoride precursor and an ammonia precursor may be supplied at a Ga/N atomic ratio of about 20-100 to a reactor at a temperature of about 1000° C. to about 1100° C. The n-GaN layer 230 may have a thickness of about 3 µm to about 10 µm. The n-GaN layer 230 may not have any cracks, and the defect density may be less than $108/cm^2$, which may be similar to the defect density of a GaN layer grown on a sapphire substrate.

Referring back to FIG. 3, an active layer 240 having a multi-quantum well structure may be deposited on the n-GaN layer 230, and a p-GaN layer 250 may be grown on the active layer 240. A transparent electrode layer 260 may be deposited on the p-GaN layer 250. Forming the active layer 240, the p-GaN layer 250, and the transparent electrode layer 260 may be performed using well-known manufacturing processes. As a result, a detailed explanation thereof will not be given.

Figure 5A:
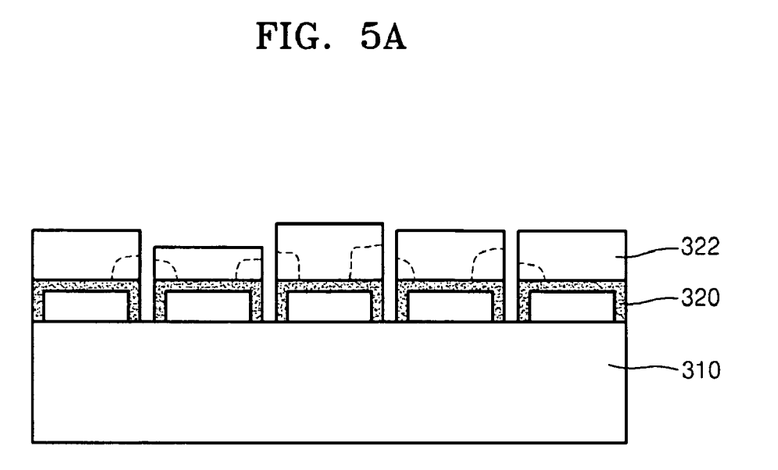
FIGS. 5A and 5B are cross-sectional views illustrating a defect density reduction mechanism according to example embodiments.
Figure 5B:
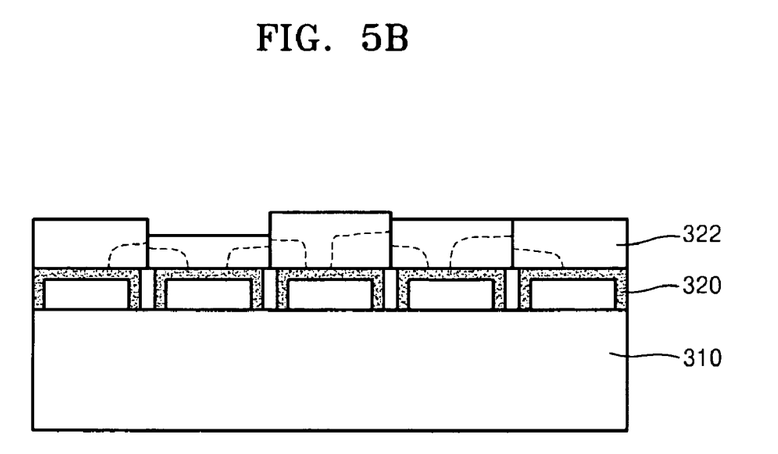

FIGS. 5A and 5B are cross-sectional views illustrating a defect density reduction mechanism according to example embodiments. Referring to FIG. 5A, a plurality of rods 320 are formed spaced apart from each other on a silicon substrate 310. Although the rods 320 resemble the hollow n-GaN rods 220 of FIG. 3, the rods 320 may also resemble the n-GaN rods 120 of FIG. 1. An n-GaN body 322 is vertically grown on each of the rods 320. Dislocations (marked by dotted lines) may occur in the n-GaN body 322.

On the other hand, referring to FIG. 5B, an n-GaN body 322 is horizontally grown on each of the rods 320 such that adjacent n-GaN bodies 322 contact each other. As a result, the dislocations (marked by dotted lines) may be laterally bent and reduced. The space between each of the rods 320 may help reduce the dislocations. Furthermore, because the contact area between the silicon substrate 310 and the rods 320 may be reduced when the rods 320 are hollow (as opposed to being solid), residual stress may be decreased, thereby further reducing or preventing the occurrence of cracks.

Figure 6:
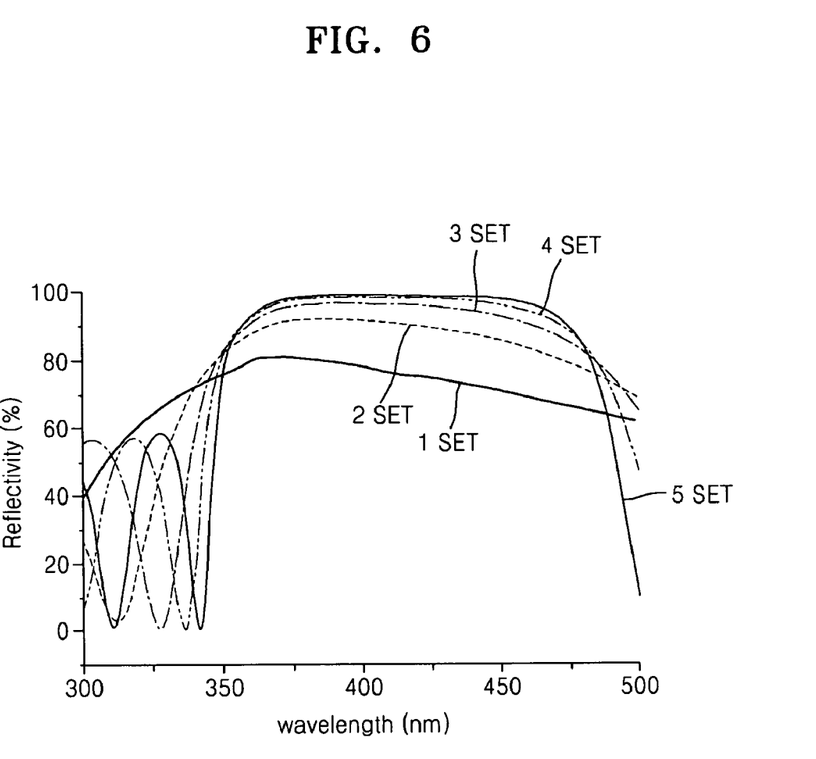
FIG. 6 is a graph illustrating simulation results of the luminous efficiency of a semiconductor light emitting device according to example embodiments.

FIG. 6 is a graph illustrating simulation results of the luminous efficiency of a semiconductor light emitting device according to example embodiments. The luminous efficiency and reflectivity of a semiconductor light emitting device having a $TiO_2/SiO_2/Si$ structure (wherein a $TiO_2$ layer and a $SiO_2$ layer are sequentially stacked on a Si substrate) bear a relatively strong relationship to each other. The reflectivity of first through fifth semiconductor light emitting devices having one to five sets, respectively, was measured, wherein each set consisted of one $TiO_2$ layer and one $SiO_2$ layer.

The $TiO_2$ layers had a refractive index of 2.52 and a thickness of 40.47 nm, and the $SiO_2$ layers had a refractive index of 1.47 and a thickness of 69.42 nm. As shown in FIG. 6, the reflectivity to light having wavelengths of about 350 nm to about 450 nm increased as the number of sets increased in the semiconductor light emitting devices. In particular, the reflectivity of semiconductor light emitting devices having three, four, and five sets was relatively high. Accordingly, because the absorption of light emitted by light emitting devices having three, four, and five sets is reduced, luminous efficiency may be improved.

As described above with regard to example embodiments, a GaN layer grown on a silicon substrate may have relatively few cracks, and the defect density of a GaN layer grown on a silicon substrate may be about equal to that of a GaN layer grown on a sapphire substrate. Also, because a silicon wafer having a relatively large diameter may be used, manufacturing costs may be reduced. Furthermore, because a reflective layer is used, luminous efficiency may be improved.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A method of manufacturing a semiconductor light emitting device, comprising:
    forming an insulating layer on a substrate;
    forming a reflective layer on the insulating layer:
    forming a plurality of first holes in the insulating layer and the reflective layer;
    forming a plurality of gallium nitride (GaN) rods in the plurality of first holes;
    laterally growing an n-GaN layer on the GaN rods; and
    sequentially forming an active layer and a p-GaN layer on the n-GaN layer.

2. The method of claim 1, wherein the substrate is a silicon substrate.

3. The method of claim 1, wherein the GaN rods have a height greater than a thickness of the insulating layer.

4. The method of claim 1, wherein each of the GaN rods has a diameter of about 10 nm to about 100 nm.

5. The method of claim 1, wherein the insulating layer is formed of silicon dioxide ($SiO_2$).

6. The method of claim 1, wherein the reflective layer is formed of titanium dioxide ($TiO_2$).

7. The method of claim 1, wherein the GaN rods have a height greater than a combined thickness of the insulating layer and the reflective layer.

8. The method of claim 1, further comprising:
    forming a stack of 3 to 5 sets of the insulating layer and the reflective layer prior to forming the plurality of first holes, wherein the reflective layer on the insulating layer constitutes a set.

9. The method of claim 1, wherein each of the insulating layer and the reflective layer has a thickness of about 10 nm to about 100 nm.

* * * * *